(12) United States Patent
Jain et al.

(10) Patent No.: US 9,001,569 B1
(45) Date of Patent: Apr. 7, 2015

(54) INPUT TRIGGER INDEPENDENT LOW LEAKAGE MEMORY CIRCUIT

(71) Applicant: Synopsys, Inc., Mountain View, CA (US)

(72) Inventors: Sanjeev Kumar Jain, Uttar Pradesh (IN); Vikas Gadi, Indirapuram Ghaziabad (IN); Amit Khanuja, New Delhi (IN)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 14/035,778

(22) Filed: Sep. 24, 2013

(51) Int. Cl.
*G11C 11/00* (2006.01)
*G11C 8/08* (2006.01)
*G11C 11/413* (2006.01)
*G11C 8/10* (2006.01)

(52) U.S. Cl.
CPC ............... *G11C 8/08* (2013.01); *G11C 11/413* (2013.01); *G11C 8/10* (2013.01)

(58) Field of Classification Search
CPC ........ G11C 7/06; G11C 8/08; G11C 11/4091; G11C 11/4094; G11C 5/143; G11C 11/402; G11C 11/406

USPC .............. 365/230.06, 200, 229, 226, 230.03, 365/233.1, 225.7
See application file for complete search history.

(56) References Cited

U.S. PATENT DOCUMENTS 7,061,794 B1  6/2006  Sabharwal et al.
7,940,550 B2  5/2011  Behera et al.

*Primary Examiner* — Thong Q Le
(74) *Attorney, Agent, or Firm* — Bever, Hoffman & Harms, LLP

(57) ABSTRACT

Wordline-driver biasing and column-based source-biasing circuitry facilitate reduced current leakage, for example, in SoC device SRAM circuits in a manner that is independent of the read/write/standby operating mode, and without an external trigger. Wordline-driver-biasing circuitry turns off (i.e., decouples from system power) wordline-drivers that are connected to unselected wordlines during read/write operations using one of a decoder-enable signal, which is generated in response to row address values, or based on the activation of a self-timing internal clock, which is generated by the memory circuit when it is activated (i.e., switched from standby to read/write mode). Alternatively, or in addition, source-biasing circuitry applies a relatively high source-biasing voltage to the source terminals of memory cells in unselected columns during read/write operations based on column address values (i.e., a low source voltage is applied only to the selected column being written to or read from).

19 Claims, 11 Drawing Sheets

INPUT TRIGGER INDEPENDENT LOW LEAKAGE MEMORY CIRCUIT

FIELD OF THE INVENTION

The present disclosure relates generally to semiconductor memories utilized, for example, in system-on-chip (SoC) devices. More particularly, and not by way of any limitation, the present disclosure is directed to wordline-biasing and source-biasing schemes for reducing leakage in static random access memory (SRAM) cells utilized in portable SoC (and other electronic) devices.

BACKGROUND OF THE INVENTION

To maintain a longer battery life, especially for handheld and biomedical SoC devices, it becomes important to reduce total charge drained, which is a combination of charge drained during both active cycle and standby (sleep) modes. Active cycle operations typically require supplying power to all functional (logic and memory) circuitry of the SoC device, and as such charge drain reduction schemes that can be implemented during active cycle operations is typically limited. Accordingly, the conventional methodology for reducing total charge drained typically involves switching the SoC device to a standby (sleep) mode (i.e., during inactive periods), which involves utilizing power switches to de-couple non-essential circuitry from the power supply.

SoC devices typically include a central processor and other logic circuitry, and one or more memory circuits. In order for the SoC device to switch quickly back from the standby mode to the active cycle mode quickly, power is maintained in critical areas, such as in the portion of the central processor that controls to power switches to "wake up" the powered-down circuitry, and memory circuits that store ongoing operating information. Because the memory circuits constitute a major part (typically up to 70%) of the silicon area for the current day SoC device, the power consumed by the memory circuits, even during standby mode, is significant. Further, as transistor device sizes continue to decrease (e.g., 0.13 microns or smaller), several issues begin to emerge with respect to the operation of SRAM cells, chiefly because at such dimensions the devices suffer from high values of leakage in the off state in standby mode. Essentially, these devices are no longer ideal switches; rather they are closer to sieves, having a non-negligible constant current flow path from drain to source or from drain/source to substrate even in the off state. The high leakage causes two major problems. First, because of the generation of large static current as leakage, there is increased static power consumption as a result. Second, which is more serious, is the issue of incorrect data reads from the SRAM cells. The accumulated leakage current from all the cells in a selected column is now comparable to the read current, thereby significantly eroding the bitline differential required for reliable sensing operations.

FIG. 11 is a simplified block diagram showing a simplified conventional memory circuit 50 utilized in a typical SoC device. Memory circuit 50 can be functionally divided into two regions: a memory cell array region 51 and a memory logic device region 52. Memory array region 51 includes SRAM memory cells that are typically sectioned into multiple sectors (e.g., sectors 52A and 52B), where the SRAM cells in each sector are arranged in rows and columns. Memory logic device region 52 is made up of logic circuitry that controls the memory read/write operations, and generally includes a memory controller 53, a row (X) decoder 54, a column (Y) decoder 55, row post-decoder and wordline driver circuits 56A and 56B, and sense amplifier and I/O circuitry 57. Memory controller 53 functions to receive read/write command signals R/W, data signals DATA, and optional address signals ADDR and a global clock signal from the SoC central processor (not shown), transmits corresponding row address signals X-ADDR to row decoder 54, transmits corresponding column address signals Y-ADDR to column decoder 56, generates other memory control signals CNTRL and a self-timing clock signal CLK_ST that are utilized to coordinate the read/write operation. Row decoder 54 partially decodes row address signal X-ADDR and transmits the partially decoded address data to post decoder circuitry that then controls (drives) associated wordlines in circuits 56A and 56B. Similarly, column decoder 55 decodes column address signal Y-ADDR to control sense amplifier and I/O circuitry 57.

In operation, at least a portion of memory controller 53 remains active during standby mode to receive address and data information from the SoC central processor (not shown). Upon receiving a read/write operation command signal R/W, memory controller 53 initiates (generates) self-timing clock signal CLK_ST and control signals CNTRL that prepare the remaining logic circuitry for the specified read/write operation. Prior to reading the single data bit stored on a targeted SRAM cell in a typical read operation, the bitlines connected to the targeted SRAM cell are precharged and equalized to a common value, and then the wordline connected to the targeted SRAM cell is activated by an associated wordline driver in one of circuits 56A or 56B such that the SRAM cell pulls one of the bitlines toward ground, with the other bitline remaining at the precharged level, typically $V_{DD}$. That is, a first of the two bitlines is pulled low and the second bitline remains high when the stored data bit value is "0", and the second bitline is pulled low and the first bitline remains high when the stored data bit value is "1". The sense amplifier in circuit 57 senses the difference between the two bitlines once it exceeds a predetermined value, and the sensed difference is latched and output as the stored "0" or "1" data value.

As discussed above, the conventional method for maximizing battery life in portable SoC devices is to power-down non-critical portions of the logic circuitry of memory circuit 50 during standby modes. However, because SRAM cells require continuous power to retain stored data, and because the memory array 52 is required to store data even when memory circuit 50 is in the standby mode, power is consumed by the SRAM cells at all times. Further, because SRAM cells are produced using increasingly smaller transistors that exhibit higher current leakage, the leakage problem associated with SRAM arrays is becoming an increasingly significant problem.

Two prior are methods that attempt to address array leakage problem are described in U.S. Pat. Nos. 7,061,794 and 7,940,550. The method taught in U.S. Pat. No. 7,061,794 involves source biasing based on wordline selection. Specifically, a source-bias voltage is selectively applied to unselected SRAM cells based the currently selected wordline, where the source-bias voltage reduces source/drain leakage by reducing the source/drain voltage (i.e., by increasing the applied source voltage). However, the wordline source-bias approach has a disadvantage in that the associated logic circuitry has a significant area overhead (i.e., a significant portion of the SoC chip is needed to implement the wordline source-biasing circuitry). As indicated in FIG. 11, a second source biasing approach taught in U.S. Pat. No. 7,940,550 involves dividing memory array 52 into sectors 52A and 52B, and utilizing a source bias signal generator circuit 58 and source biasing circuits 59A and 59B to apply the source-bias voltage to the SRAM cells in non-selected memory sectors 52A or 52B based on the row address values generated by row decoder 54. Although this second approach reduces area overhead and provides some advantages over the wordline source-biasing approach, it still requires significant chip area to implement source-bias signal generator 58 and requires area between memory sectors 52A and 52B to implement source bias circuits 59A and 59B, and essentially only operates when the memory array sector is in a standby mode.

What is needed are improved systems and methods for reducing leakage in memory circuits in general, and in SRAM arrays in particular, that have minimal area overhead, and preferably function in both active cycle and standby modes.

SUMMARY

The present invention is directed to a memory array circuit that achieves leakage reduction in a way that utilizes existing control signals (i.e., control signals that are generated in conventional memory circuits) to either perform a wordline bias operation, perform a column-based source-bias operation, or simultaneously perform both wordline bias and column-based source-bias operations. Wordline bias is achieved by disabling (i.e., de-coupling from system power) at least some of the non-selected wordline drivers under at least some operating conditions (e.g., during read/write operations when the wordline drivers are otherwise passive (i.e., not generating a high wordline voltage) or during standby mode (e.g., by sensing the de-activation of a self-timing clock signal) such that unnecessary current leakage through the wordline drivers is essentially eliminated. Column-based source-bias is achieved by biasing SRAM source potentials using existing column address signals such that SRAM cells in all unselected adjacent columns are maintained at a raised source bias voltage during read/write operations. The advantage of the column based source biasing method is that it saves an extra pin (in comparison to prior art source-biasing methods) and no need to go into separate leakage saving mode (i.e., the column-based source-bias scheme operates in either standby or read/write operating modes). Using one or both of these wordline-bias and column-based source-bias methods, the present invention provides memory circuits that facilitate longer battery life for portable (e.g., handheld or biomedical) devices.

According to an exemplary embodiment of the present invention, the memory cell array including memory cells arranged in row groups that are connected to associated wordlines and column groups connected to associated bitlines, a row-address post decoder, wordline drivers respectively connected between the row-address post decoder and associated wordlines, and one or more bitline bias control circuits. During a read/write operation, the row-address post decoder decodes a received row address value and asserts (e.g., switches from 0V to system voltage $V_{DD}$) a single wordline control signal corresponding to the associated row address value, whereby the asserted wordline control signal causes its associated wordline driver to generate a high voltage signal (e.g., system voltage $V_{DD}$) on an associated wordline. According to an aspect of the present invention, the bitline bias control circuit includes one or more switch elements that disconnect one or more associated wordline drivers from the system voltage supply using an associated driver enable signal that is generated in response to operating signals generated inside the memory array circuit (e.g., using the row address signals, or using a self-timing clock signal that is generated whenever the memory circuit is switched from standby mode to operating (read/write) mode). By utilizing operating signals that are already generated inside the memory array circuit to enable/disable the wordline drivers by way of these switch elements, the present invention facilitates leakage reduction with minimal changes to existing memory circuit designs and without requiring dedicated external control signals.

According to alternative embodiments, the number of switch elements utilized in the memory array is adjusted to either minimize chip area required to implement wordline bias control, or to maximize leakage reduction. In some embodiments, a relatively large number of switch elements are utilized to respectively control a relatively small number of wordline drivers (e.g., one switch element controls one or a few wordline drivers), thereby requiring a relatively large amount of chip area for implementing the wordline bias control, but increasing leakage reduction by minimizing the number of "active" wordline drivers at a given time. In alternative specific embodiments, a relatively small number of switch elements are utilized to respectively control a large number of wordline drivers, thereby minimizing the area required to implement the wordline bias control circuitry.

According to an embodiment of the present invention, each wordline bias circuit utilizes signals generated in the row (X) decoder circuitry to switch on (close) or switch off (open) the switch gates, thereby controlling the power supplied to associated wordline drivers. For example, when the row (X) decoder circuitry receives a first address signal corresponding to generating a high wordline voltage on a selected wordline, the wordline bias circuit generates a wordline driver enable signal that closes a first switch element to supply system power to a first wordline driver (or first set of wordline drivers), and at the same time maintains other switch elements in an open state, whereby the wordline drivers connected to non-selected wordlines remain turned off, thereby reducing current leakage without having to enter the standby mode. Subsequently, when the row decoder circuitry receives a second address signal corresponding to generating a high wordline voltage on another wordline, the wordline bias circuit generates a wordline driver enable signal that closes a second switch element to supply system power to a second wordline driver (or second set of wordline drivers), and at the same time opens the first switch element to disable the first switch element(s). In accordance with a preferred embodiment, each switch element is implemented by a p-channel transistor, and the wordline driver enable signals are generated as "active low" signals, whereby correct functionality is ensured.

According to another embodiment of the present invention, each wordline bias circuit includes inverted delay logic circuitry that generates one or more wordline control signals based on the activation of a self-timing clock signal, which is activated (i.e., generates a square-wave signal) when the memory circuit is enabled (i.e., switched from a standby mode to either a read operation or a write operation, which are collectively referred to herein as a "read/write" operation). In one embodiment, the inverted delay logic circuitry is utilized to close (turn on) one or more switch elements that supply power to all of the wordline drivers when activation of the self-timing clock is detected. By utilizing existing self-timing clock signals to enable/disable the wordline drivers whenever the memory circuit is in the standby mode, the present invention facilitates leakage reduction with minimal changes to existing memory circuit designs and without requiring dedicated external control signals. In another embodiment, multiple switch elements are controlled to turn on/off different sets of wordline drivers at different times based, for example, on the number of self-timing clock signal pulses that are counted, whereby the number of active wordline drivers at a given time during a read/write operation is reduced to minimize current leakage. In both of these embodiments, clock-based wordline bias control is preferably implemented using p-channel transistor switch elements and "active low" wordline driver enable signals, providing the benefit mentioned above.

According to another embodiment of the present invention, each of the memory cells in the memory cell array is a static random access memory (SRAM) cell, and the memory array circuit includes a source bias circuit that either further reduces current leakage or acts alone to reduce current leakage by biasing the source voltage applied to all unselected memory array columns during read/write operations. That is, the source bias circuit utilizes column address values to identify unselected columns during a read/write operation, and selectively increases the source voltage applied to the SRAM memory cells in the unselected columns to a median source bias voltage (e.g., in the range of 2-30% of system voltage), thereby decreasing leakage from unselected SRAMs during read/write operations. In contrast, the source bias circuit supplies a suitable read/write source potential (e.g., 0-2% of the system voltage) to the selected column to facilitate the read/write operation. By utilizing column address signals to control source biasing, and by maintaining the median source bias voltage in all unselected columns, the present invention facilitates substantially higher leakage reduction than prior art approaches in a simplified manner that is independent of the operating mode (i.e., the source biasing scheme continues to function whether the memory circuit is in either standby or read/write operating modes). In other embodiments, the source bias circuit is beneficially utilized in other memory array types (e.g., multi-port memory cells and ROM cells).

According to another embodiment of the present invention, a system on chip (SOC) device includes both at least one processor circuit and at least one memory circuit fabricated on a silicon "chip" (semiconductor substrate) such that the memory circuit(s) is/are periodically accessed by the processor circuit, where the memory circuit(s) are arranged as described above to implement one or both of wordline bias control or source bias control to minimize current leakage and maximize battery life.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in memory circuits for portable SoC and other electronic devices. The following description is presented to enable one of ordinary skill in the art to make and use the invention as provided in the context of a particular application and its requirements. As used herein, the terms "coupled" and "connected", which are utilized herein, are defined as follows. The term "connected" is used to describe a direct connection between two circuit elements, for example, by way of a metal line formed in accordance with normal integrated circuit fabrication techniques. In contrast, the term "coupled" is used to describe either a direct connection or an indirect connection between two circuit elements. For example, two coupled elements may be directly connected by way of a metal line, or indirectly connected by way of an intervening circuit element (e.g., a capacitor, resistor, inductor, or by way of the source/drain terminals of a transistor). Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
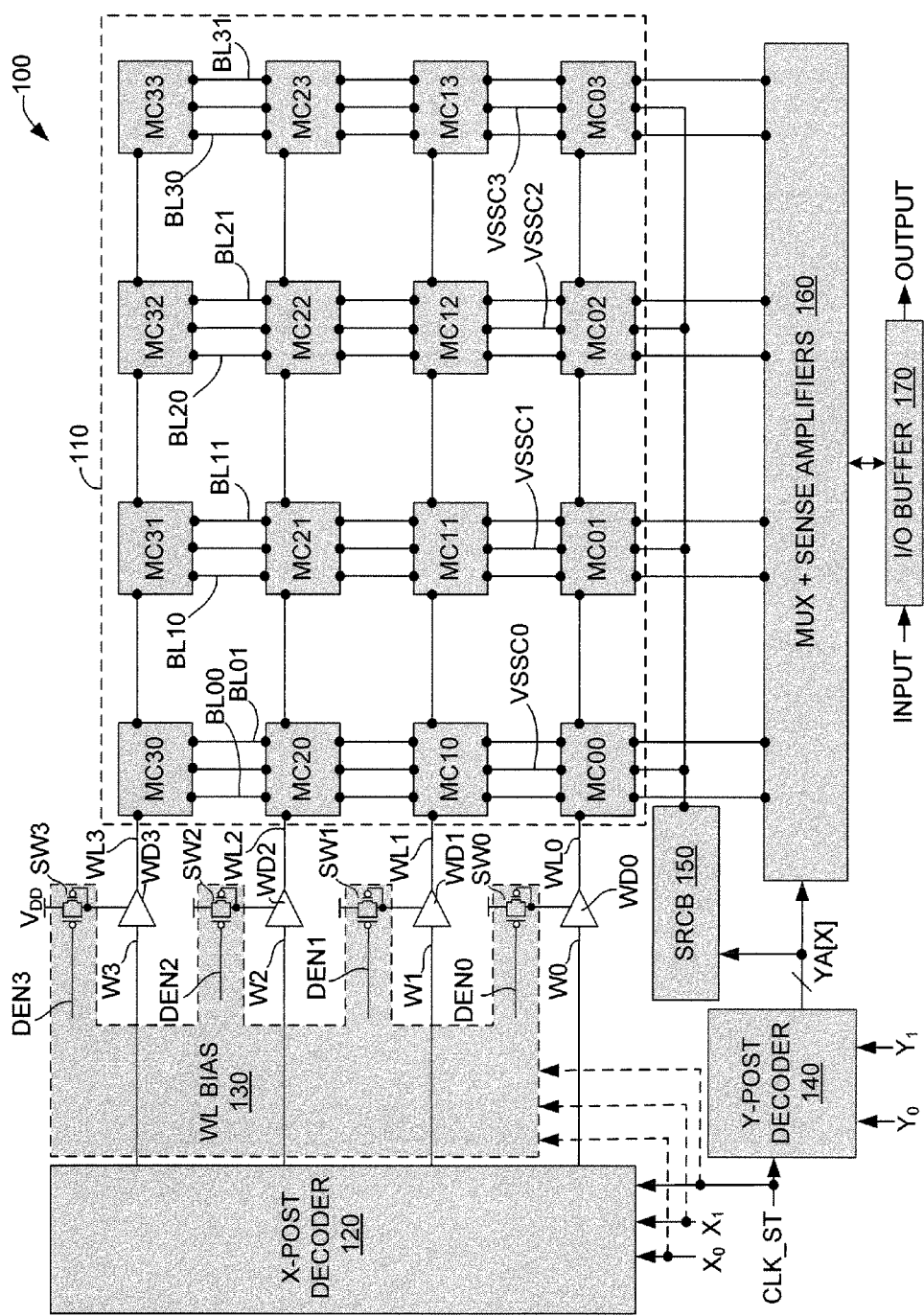
FIG. 1 is a circuit/block diagram showing a memory circuit according to a generalized embodiment of the present invention.

FIG. 1 is a circuit/block diagram showing a simplified memory circuit 100 including a memory cell array 110 and memory logic circuitry (shown outside memory array 110). For descriptive purposes, memory circuit 100 is described below with reference to a small number of memory cells disposed in a single sector, and with reference to logic circuitry that is relevant to the features associated with the disclosed invention. Practical memory circuits include a much larger number of memory cells and additional logic circuitry than that described below, and it is the intent of the following description to provide those skilled in the art sufficient information to implement the present invention in such practical memory circuits.

Memory cell array 110 includes memory (e.g., SRAM or other memory) cells MC00 to MC33 that are arranged in four rows and four columns, where each row and each column are accessed by associated wordlines WL0 to WL3 and associated bitlines BL00 to BL31. The lowermost row of array 110 is formed by a first row group including cells MC00 to MC03 that are accessed by associated wordline WL0, the next row is formed by a second row group including cells MC10 to MC13 that are accessed by (connected to) wordline WL1, the next row is formed by a third row group including cells MC20 to MC23 that are accessed by wordline WL2, the uppermost row is formed by a fourth row group including cells MC30 to MC33 that are accessed by worline WL3. The leftmost column of array 110 is formed by a first column group including cells MC00 to MC30 that are accessed by associated bitlines BL00 and BL01, the next column is formed by a second column group including cells MC01 to MC31 that are accessed by associated bitlines BL10 and BL11, the next column is formed by a third column group including cells MC02 to MC32 that are accessed by associated bitlines BL20 and BL21, the rightmost column is formed by a fourth column group including cells MC03 to MC33 that are accessed by associated bitlines BL30 and BL31.

The memory logic circuitry of memory circuit 100 includes controller and row/column decoder circuitry (not shown) that generate various control signals and perform various control functions according to known techniques. For purposes of describing the present invention, one relevant function performed by the controller/decoder circuitry involves generating row address signals $X_0$ and $X_1$ that are supplied to a row post-decoder (X-POST DECODER) circuit 120, which activates a selected wordline driver WD0 to WD3 by way of asserting an associated wordline control signal W0-W3 in accordance with row address signals $X_0$ and $X_1$ during read/write operations. Note that each wordline driver WD0 to WD3 is connected between row-address post decoder 120 and an associated wordline WL0 to WL3 and is constructed according to known techniques such that each wordline driver (e.g., wordline driver WD0) generates a high voltage signal $V_{DD}$ on its associated wordline (e.g., wordline WL0) in response to its associated wordline control signal (e.g., when wordline control signal W0 is driven high). Another relevant function performed by the controller/decoder circuitry (not shown) involves generating column address signals $Y_0$ and $Y_1$ that are supplied to a column post-decoder (Y-POST DECODER) circuit 140, which in turn activates one of four column address lines (indicated by line YA[X]) that are utilized by a multiplexer (MUX) and sense amplifier circuit 160 to access an associated pair of selected bitlines (i.e., bitlines BL00 and BL01, bitlines BL10 and BL11, bitlines BL20 and BL21, or bitlines BL30 and BL31), whereby a read/write operation is enabled for the column of memory cells connected to the selected pair of bitlines. Yet another relevant function performed by the controller/decoder circuitry (not shown) involves transmitting input data to an I/O buffer circuit 170, which is transferred to array 110 by way of mux and sense amplifier circuit 160 during write operations, and receiving output data from I/O buffer circuit 170, which is transferred from array 110 by way of mux and sense amplifier circuit 160 during read operations. Another relevant function that is sometimes performed by the controller/decoder circuitry (not shown) involves, upon receiving a memory enable signal (i.e., a command for switching memory circuit 100 from a standby mode to an active cycle (read/write) operating mode), generating a self-timing clock signal CLK_ST that is supplied to various logic circuits (e.g., row post decoder circuit 120 and column post decoder circuit 140) for purposes of coordinating the operations of memory circuit 100.

According to an aspect of the present invention, memory circuit 100 includes one or more of a wordline-bias (WL BIAS) circuit 130 and a column-based source-bias (SRCB) circuit 150 that achieve leakage reduction using existing control signals (i.e., one or more of the control signals mentioned above that are typically generated in conventional memory circuits). The advantage of utilizing existing memory control signals to control wordline-bias circuit 130 and source-bias circuit 150 is that this approach minimizes the chip area required for control circuitry, and avoids the need for the extra external pin that is needed in some prior art leakage reduction approaches. Further, by providing memory circuit 100 with at least one of wordline-bias circuit 130 and source-bias circuit 150, the present invention facilitates the production of portable SOC (and other electronic) devices having a longer battery life.

According to an aspect of the present invention, wordline-bias circuit 130 utilizes wordline bias switches SW0 to SW4 and associated control circuitry (described below) to disable (i.e., de-couple from system power $V_{DD}$) at least some of the non-selected wordline drivers WD0 to WD3 under at least some operating conditions using either address signals (e.g., row address signals $X_0$ and $X_1$) generated by the row decoder circuitry, or using other control signals (e.g., self-timing clock signal CLK_ST) that are ordinarily generated during conventional memory circuit operations. Wordline bias switches SW0 to SW4 (e.g., p-channel transistors with parallel PMOS diodes) are respectively connected between system power source $V_{DD}$ and a power terminal of at least one of wordline drivers WD0 to WD3 (in the generalized embodiment, each switch SW0 to SW4 is connected to the high power terminal of wordline drivers WD0 to WD3, respectively, but in other embodiments each wordline bias switch is used to control two or more wordline drivers). The control circuitry (not shown) of wordline-bias circuit 130 controls the on/off state of wordline bias switches SW0 to SW4 by way of driver enable signals DEN0 to DEN3, respectively. As described in the exemplary embodiments below, the control circuitry of wordline-bias circuit 130 functions to disable unselected drivers (i.e., to assert at least some of driver enable signals DEN0 to DEN3) during a read/write operation, for example, using row address signals $X_0$ and $X_1$ or self-timing clock signal CLK_ST to identify and disable wordline drivers connected to non-selected wordlines. As defined herein, when a wordline driver is "disabled", its power terminal is de-coupled from the system power supply such that it is incapable of generating a high wordline signal in response to an asserted wordline control signal. As such, unnecessary current leakage through disabled wordline drivers is essentially eliminated without requiring memory circuit 100 to switch into a leakage reducing standby mode (i.e., the wordline biasing methodology provides leakage even during normal operation modes). In addition, when memory circuit 100 is provided with standby mode operations, wordline-bias circuit 130 functions to turn off wordline drivers WD0 to WD4 by sensing the de-activation of self-timing clock signal CLK_ST, thereby providing leakage reduction without requiring complex control circuitry.

According to another aspect of the present invention, column-based source-bias circuit 130 functions to apply a bias voltage to the source potentials of unselected SRAM-type memory cells in each column group by way of optional source-bias control line VSSC0 to VSSC3. As described in additional detail below, the logic circuitry of source-bias circuit 130 identifies the selected and unselected column groups of memory array 110 at each particular time period during a read/write operation, and applies a low (first) voltage (e.g., 0V or less than 2% of $V_{DD}$) to the source terminal of each SRAM cell in the selected column group by way of an associated source-bias control line VSSC0 to VSSC3 (e.g., source-bias control line VSSC0) to facilitate the required read/write operation while applying a bias (second) voltage (e.g., in the range of 2 to 30% of $V_{DD}$) to the source terminals of the SRAM cells in the non-selected column groups by way of the remaining source-bias control lines (e.g., VSSC1 to VSSC3). This source bias voltage is preferably set such that the difference in supply voltage and source bias voltage is always less than the retention voltage of the memory cells across all functional process, voltage and temperature ranges. When the read/write operation proceeds, for example, to read from or write to the next sequential column group, the low voltage is applied to the source terminal of each SRAM cell in the next sequential column group by way of an associated source-bias control line (e.g., source-bias control line VSSC1), and the source bias voltage is applied to the source terminals of the SRAM cells in the non-selected column groups (e.g., by way of source-bias control lines VSSC1, VSSC2 and VSSC3). By applying the bias voltage to all unselected SRAM cells during read/write operations, current leakage in memory circuit 100 is significantly reduced over source biasing methods than maintain low (read) voltages to SRAM cells in non-selected column groups during read operations. Further, the column-based source biasing methodology functions without requiring memory circuit 100 to switch into a leakage reducing standby mode (i.e., source-bias circuit 150 functions to apply the bias voltage to all of the SRAM cells MC00 to MC33 when memory circuit is in a standby mode), thereby saving an extra pin required in at least some prior art source-biasing approaches.

The wordline biasing and column-based source-biasing methodologies are described below with reference to exemplary specific embodiments. Utilizing one or more of the methodologies described below provides significant leakage savings (up to around 15-20%) during read and write operations, and major leakage components of a memory are reduced significantly. Further, at least some of the exemplary embodiments are implemented with negligible impact on critical path timing.

Figure 2:
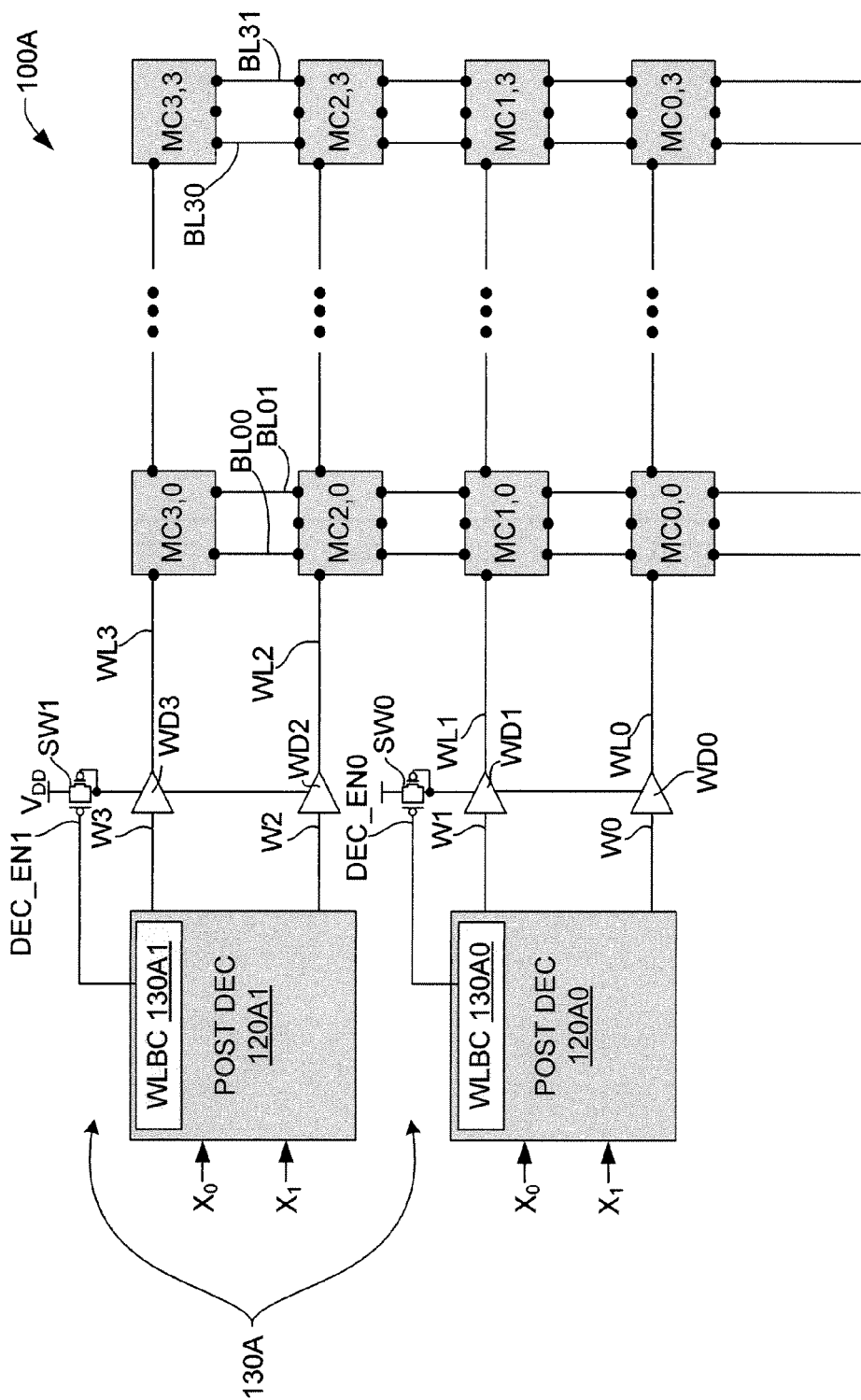
FIG. 2 is a partial circuit/block diagram showing a memory circuit according to an embodiment of the present invention.

FIG. 2 is a partial circuit/block diagram showing a memory circuit 100A according to a first exemplary wordline-biasing embodiment in which a wordline bias circuit 130A includes logic circuit components 130A1 and 130A02 that utilizes row address information to generate associated decoder-based driver enable signals DEC_EN0 and DEC_EN1, which are then utilized to control switch elements SW0 and SW1.

According to an aspect of memory circuit 100A, in contrast to the arrangement indicated in FIG. 1 where each switch element SW0 to SW3 is connected between system power source $V_{DD}$ and an associated wordline driver WD0 to WD3, switch elements SW0 and SW1 of wordline bias circuit 130A is utilized to control two wordline drivers. Specifically, switch SW0 is connected between system power source $V_{DD}$ and the power terminal of wordline drivers WD0 and WD1, whereby driver enable signal DEC_EN0 simultaneously turns on/off wordline drivers WD0 and WD1. Similarly, driver enable signal DEC_EN1 simultaneously turns on/off wordline drivers WD0 and WD1 by way of switch SW1. Using a relative large number of switches (e.g., as indicated in FIG. 1) requires a relatively large amount of chip area for implementing the wordline bias control circuitry, but increases leakage reduction by minimizing the number of "active" wordline drivers at a given time. In contrast, utilizing one switch to turn on/off two or more wordline drivers at a time minimizes the area required to implement the wordline bias control circuitry, but more wordlines remain active at a given time.

Figure 3A:
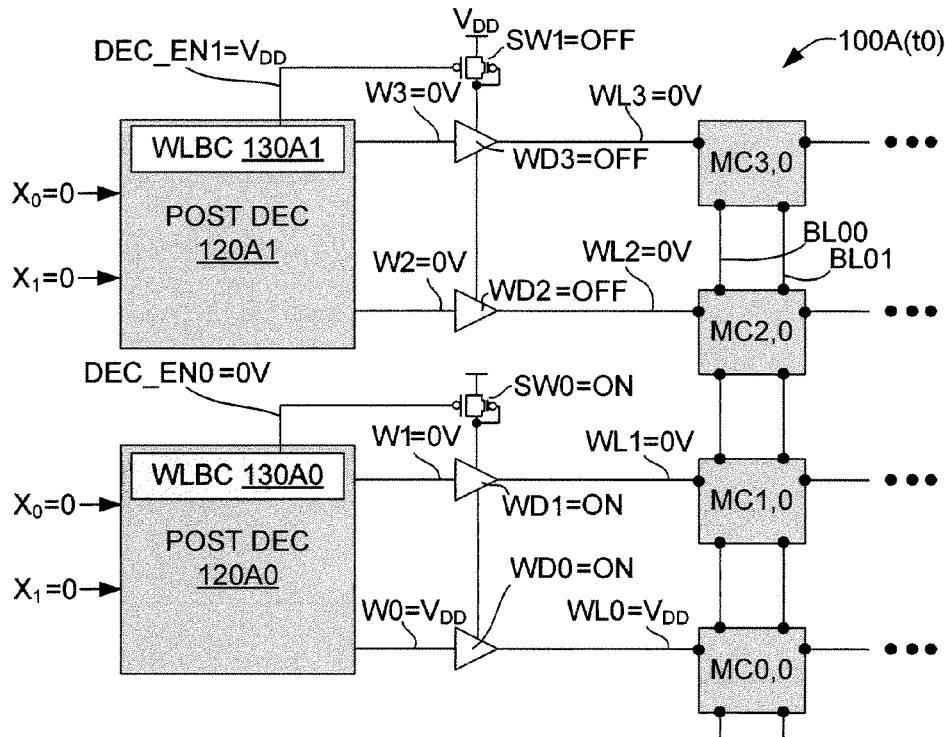
FIGS. 3(A) and 3(B) are a partial circuit/block diagrams showing operating states of the memory circuit of FIG. 2 during different time periods.
Figure 3B:
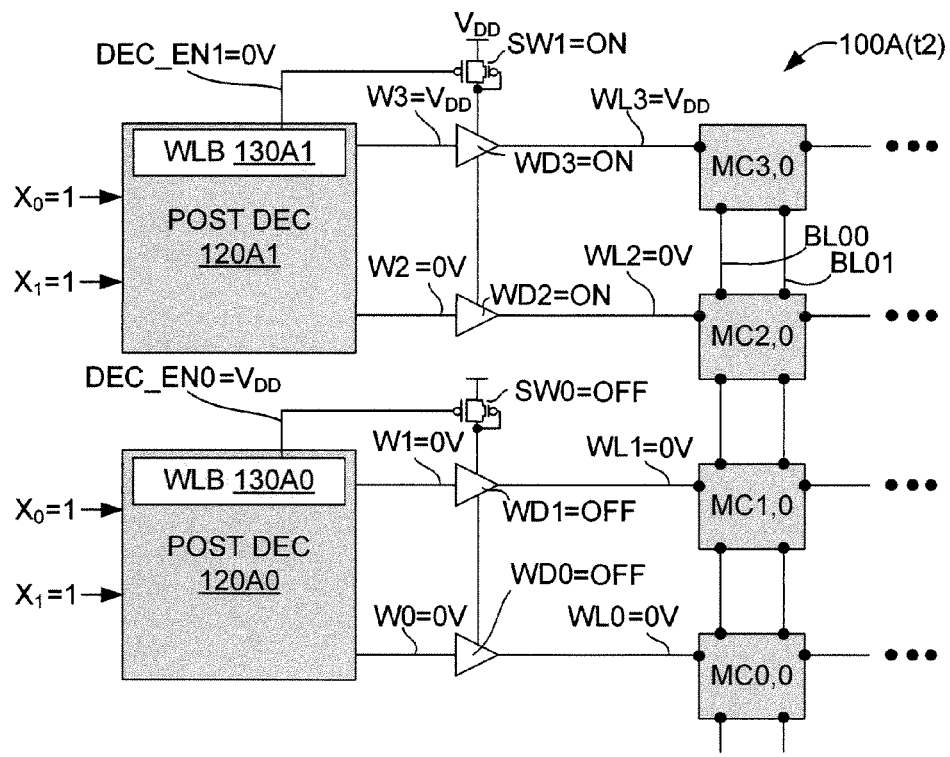

FIGS. 3(A) and 3(B) show a portion of memory circuit 100A (FIG. 2), and indicate operating states at different times during a read/write operation. Using a descriptive method utilized in other embodiments below, FIG. 3(A) references memory circuit 100A(t0), which includes operating state details of memory circuit 100A at a time t0, and FIG. 3(B) references memory circuit 100A(t1), which includes operating state details of memory circuit 100A at a time t1, where time t1 occurs after time to.

As is known in the art, at a given point during a read/write operation, a memory circuit's row decoder utilizes one or more post decoder circuits (e.g., post decoder circuits 120A0 and 120A1) to assert a single wordline control signal (e.g., control signals W0 to W3) in accordance with associated row address values (e.g., address values $X_0$ and $X_1$). In the simplified example depicted in FIG. 3(A), when values $X_0$ and $X_1$ are logic "0", post decoder 120A0 asserts wordline control signal W0 (W0=$V_{DD}$) and de-asserts wordline control signal W1 (W1=0V), while post decoder 120A1 de-asserts both wordline control signals W2 and W3. As indicated in FIG. 3(B), when values $X_0$ and $X_1$ are logic "1", post decoder 120A1 asserts wordline control signal W3 (W3=$V_{DD}$) and de-asserts wordline control signal W2 (W2=0V), while post decoder 120A0 de-asserts both wordline control signals W0 and W1. In a similar manner (not shown), when value $X_0$ is logic "0" and value $X_1$ is logic "1", post decoder 120A0 asserts wordline control signal W1 and de-asserts wordline control signal W0 (wordline control signals W2 and W3 are de-asserted), and when value $X_0$ is logic "1" and value $X_1$ is logic "0", post decoder 120A1 asserts wordline control signal W2 and de-asserts wordline control signal W3 (wordline control signals W0 and W1 are de-asserted).

As is also understood in the art, at a given point during a read/write operation, the asserted wordline control signal activates an associated wordline driver (e.g., control signals W0 to W3 activate wordline drivers WD0 to WD3, respectively) in order to generate a high voltage on one of wordlines WL0 to WL3 that accesses the memory cell row group identified by the current row address. Using the example shown in FIG. 3(A), when wordline control signal W0 is asserted (W0=$V_{DD}$), wordline driver WD0 is activated (WD0=ON) to generate a high voltage signal onto wordline WL0 (WL0=$V_{DD}$). Subsequently, as shown in FIG. 3(B), when wordline control signal W0 is de-asserted (W0=0V), wordline driver WD0 is de-activated (WD0=OFF) and a low voltage signal is generated on wordline WL0 (WL0=0V). Each of the other wordline drivers WD1 to WD3 operates in a similar manner.

According to another aspect of memory circuit 100A, logic circuitry 130A0 and 130A1 of wordline bias circuit 130A utilizes row address signals (e.g., row address values $X_0$ and $X_1$) or other internal logic signals generated by post decoders 120A1 and 120A2 to assert/de-assert driver enable signals DEC_EN0 and DEC_EN1. Because switch elements SW0 and SW1 comprise p-channel transistors, asserting driver enable signals DEC_EN0 and DEC_EN1 involves utilizing an "active low" scheme in which the driver enable signals are switched from a relative high (first) "de-asserted" voltage level (e.g., $V_{DD}$) to a relatively low (second) voltage level (e.g., 0V). As indicated in FIG. 3(A), while row address signal $X_0$ has a (first) logic value "0", (first) wordline bias circuit 130A0 asserts (first) driver enable signal DEC_EN0 (i.e., signal DEC_EN0 is switched from its "inactive" state ($V_{DD}$) to its "active" state (0V) and (second) driver enable signal DEC_EN1 remains in an "inactive" state (i.e., signal DEC_EN1=$V_{DD}$) whereby driver enable signal DEC_EN0 causes switch element SW0 to couple system power source $V_{DD}$ to wordline drivers WD0 and WD1, but switch element SW1 remains "OFF" (i.e., wordline drivers WD2 and WD3 remain disabled). In this operating state, an asserted wordline enable signal transmitted from post decoder circuit 120A0 to either of wordline drivers WL0 or WL1 will result in a high wordline voltage. As indicated in FIG. 3(B), at a subsequent point during the read/write operation when row address signal $X_0$ has a (second) logic value "1", (first) wordline bias circuit 130A0 de-asserts driver enable signal DEC_EN0, and (second) wordline bias circuit 130A1 asserts (second) driver enable signal DEC_EN1 (i.e., signal DEC_EN1 is switched from its "inactive" state ($V_{DD}$) to its "active" state (0V)), whereby driver enable signal DEC_EN1 causes switch element SW1 to couple system power source $V_{DD}$ to wordline drivers WD2 and WD3 (wordline drivers WD0 and WD1 are now disabled). In this operating state, an asserted wordline enable signal transmitted from post decoder circuit 120A1 to either of wordline drivers WD2 or WD3 will result in a high wordline voltage.

By utilizing row address signals to enable one or a small number of wordline drivers during a read/write operation, and to disable most of the wordline drivers during the read/write operation, the present invention greatly reduces current leakage in memory circuit 100A, whereby battery life is lengthened in SoC (or other electronic circuits) that incorporate memory circuit 100A. Further, by implementing the wordline bias scheme using signals generated by the row decoder circuitry of memory circuit 100A (e.g., signals generated by post decoder circuits 120A0 and 120A1), the present invention facilitates wordline biasing in a way that does not introduce critical timing delays. Moreover, because this approach disables all of the wordline drivers when all of the row address signals are de-asserted (e.g., when the memory cell is waiting for a read/write command), memory circuit 100A provides significant leakage reduction without requiring entry into a standby mode.

Figure 4:
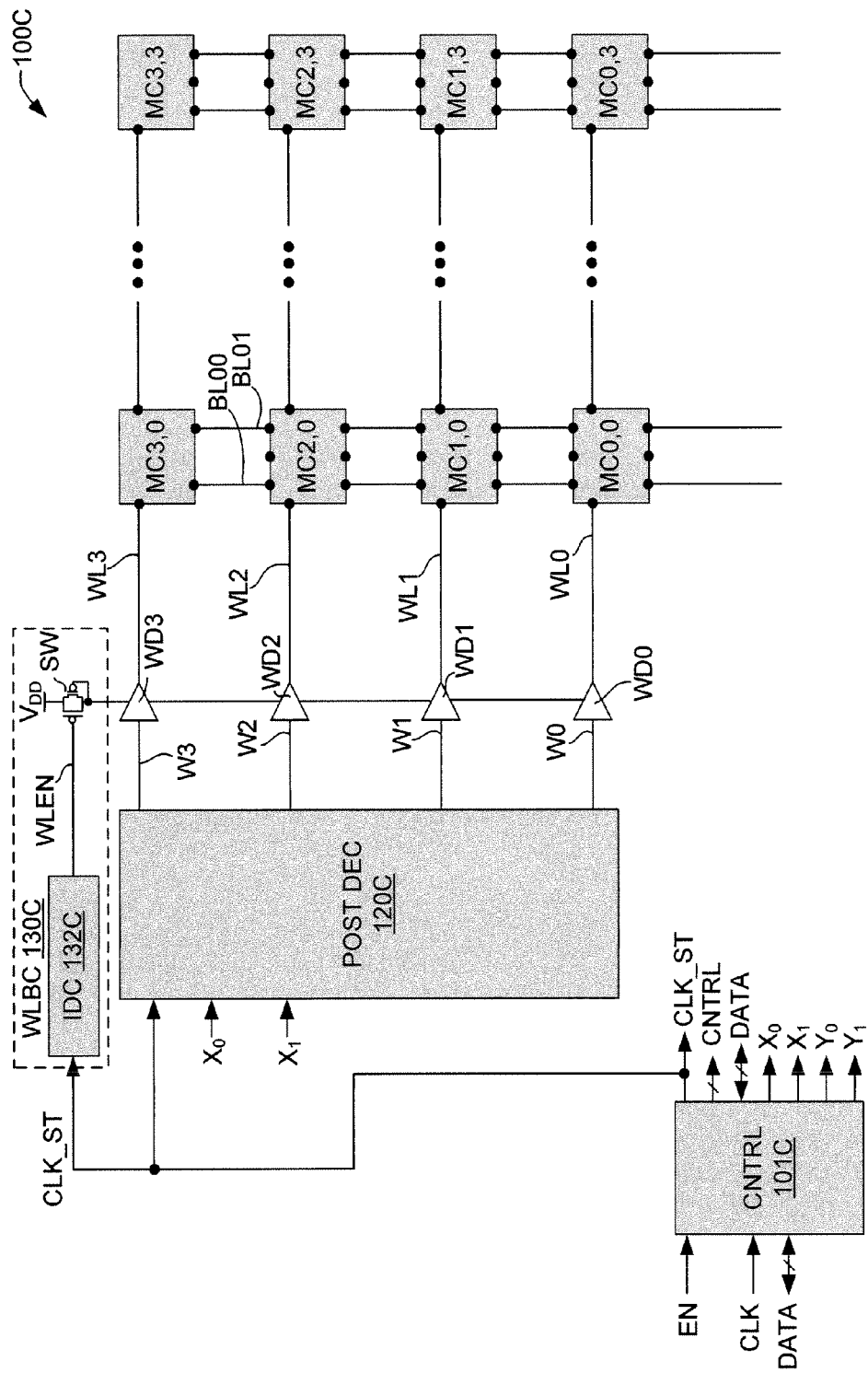
FIG. 4 is a partial circuit/block diagram showing a memory circuit according to an embodiment of the present invention.
Figure 5A:
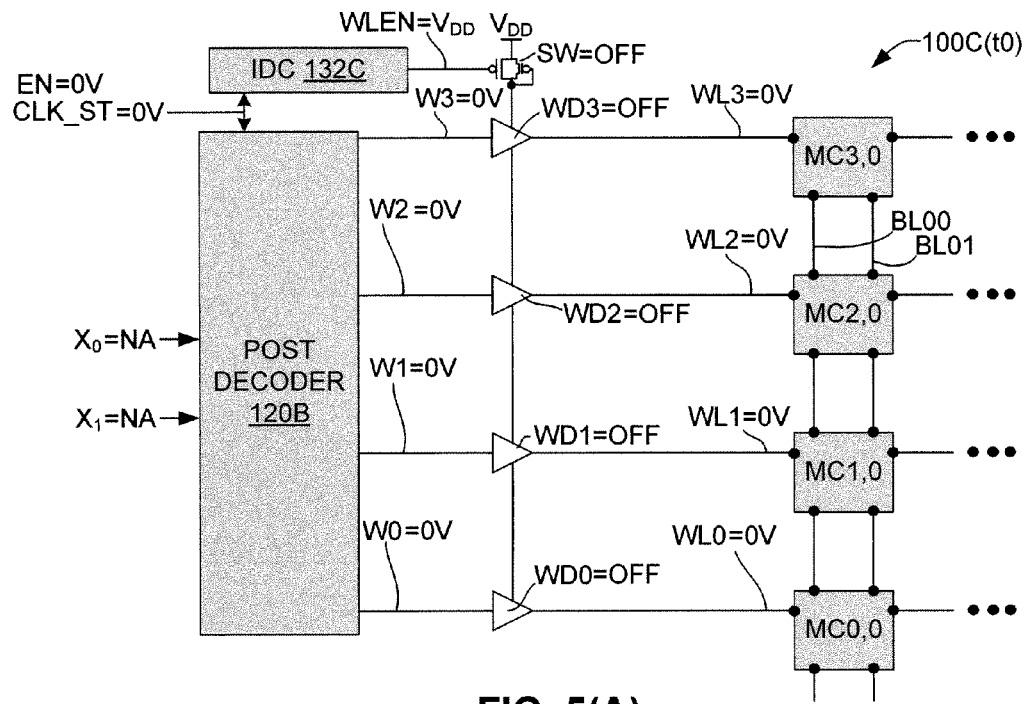
FIGS. 5(A) and 5(B) are a partial circuit/block diagrams showing operating states of the memory circuit of FIG. 4 during different time periods.
Figure 5B:
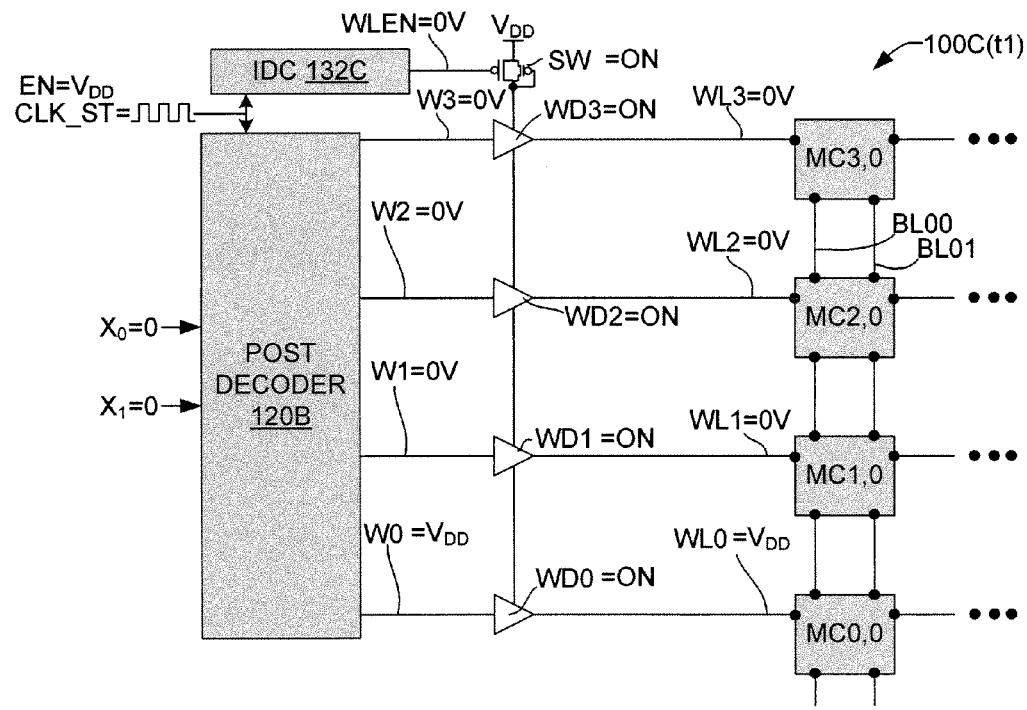

FIG. 4 is a partial circuit/block diagram showing a memory circuit 100C that implements a clock-based wordline biasing method according to another exemplary embodiment of the present invention. As described above, memory circuit 100C includes control circuitry 101C that generates row/column address signals, coordinates data I/O and in some instances generates a self-timing clock signal CLK_ST upon receiving an enable ("wake up") control signal from the central processor of a SoC (or other electronic) device in which memory circuit 100C is included. The power supply to word line drivers WD0 to WD3 is enabled during read and write operation by way of wordline bias circuit (WLBC) 130C, which utilizes an inverted delay circuit (IDC) 132C to control switch element SW. IDC circuit 132C functions like a buffer to improve the slope of control signal WLEN, and in one embodiment is implemented by series-connected inverters. As indicated in FIG. 5(A), at time t0 before a read/write operation is performed (i.e., memory enable signal EN=0V), inverted delay circuit 132C detects the non-activation of self-timing clock signal CLK_ST and generates a de-asserted driver enable signal WLEN (WLEN=$V_{DD}$) that maintains switch element SW in an "OFF" state, whereby wordline drivers WD0 to WD3 are disabled to reduce current leakage. As indicated in FIG. 5(B), at time t1 when a read/write operation is initiated, inverted delay circuit 132C detects the activation of self-timing clock signal CLK_ST, and asserts wordline driver enable signal WLEN prior to the arrival of row address values $X_0$ and $X_1$ at post decoder circuit 1200 such that, for example, wordline driver WD0 is raised to 90% of rails before wordline enable signal W0 is asserted, thereby ensuring that there is no hit on memory access time. Once the read/write operation is completed and self-timing clock signal CLK_ST is disabled, inverted delay circuit 132C again de-asserts wordline driver to disable wordline drivers WD0 to WD3.

Figure 6:
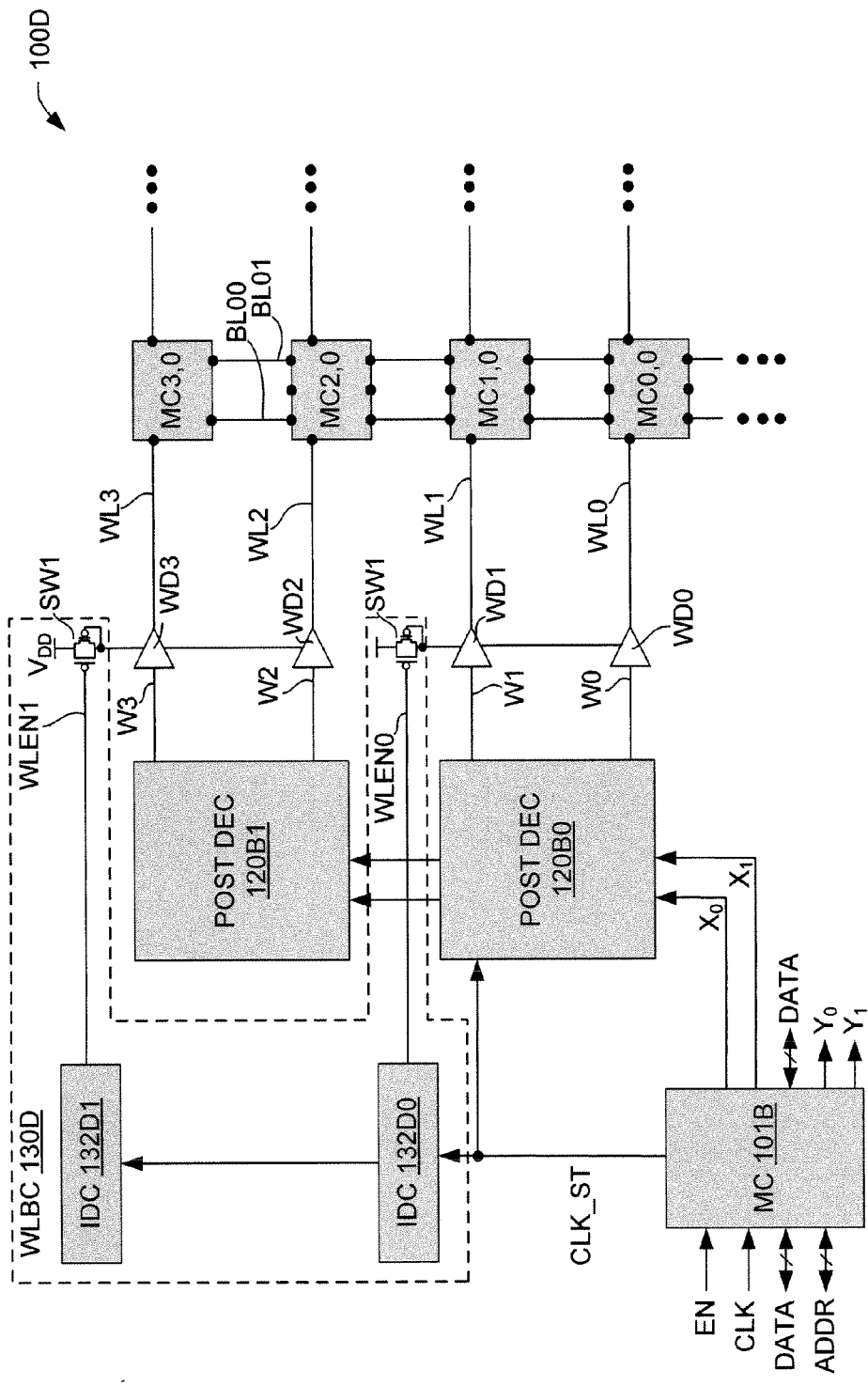
FIG. 6 is a partial circuit/block diagram showing a memory circuit according to an embodiment of the present invention.

FIG. 6 is a partial circuit/block diagram showing a memory circuit 100D that implements a second clock-based wordline biasing method in which wordline bias circuit (WLBC) 130D includes two switch elements SW0 and SW1 that are respectively controlled by two inverted delay circuits (IDC) 132D0 and 132D1, where inverted delay circuits 132D0 and 132D1 utilize different delay times to turn on/off different sets of switch elements at different times based, for example, on the number of self-timing clock signal pulses that are counted.

Figure 7A:
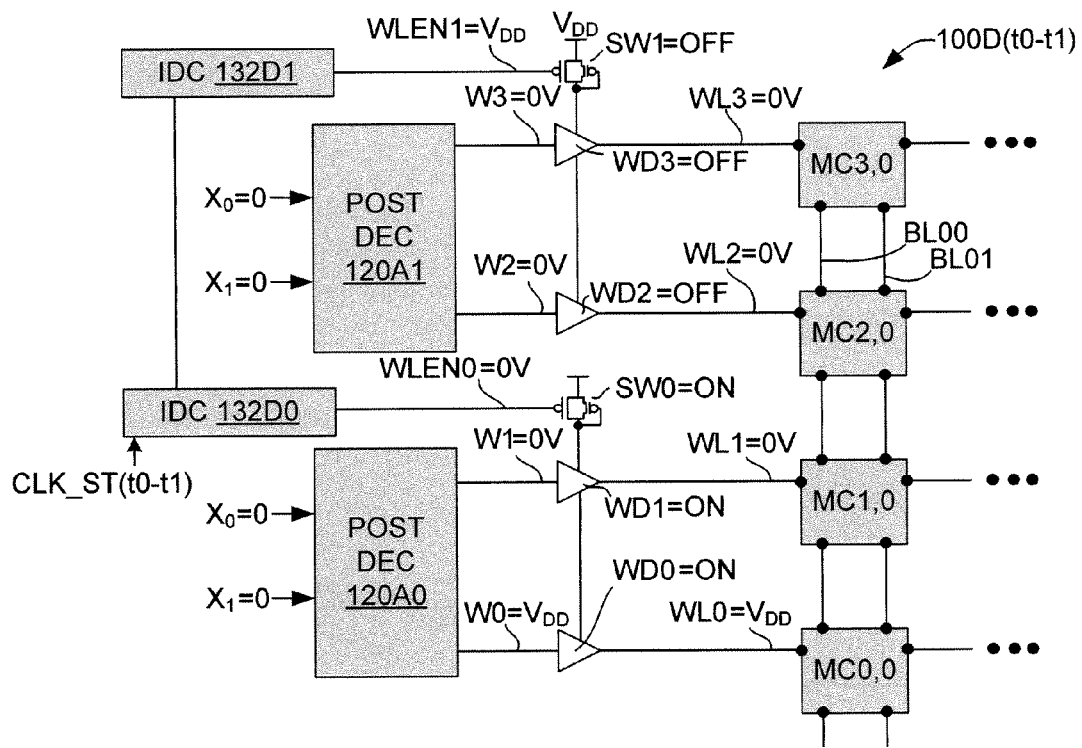
FIGS. 7(A) and 7(B) are a partial circuit/block diagrams showing operating states of the memory circuit of FIG. 6 during different time periods.
Figure 7B:
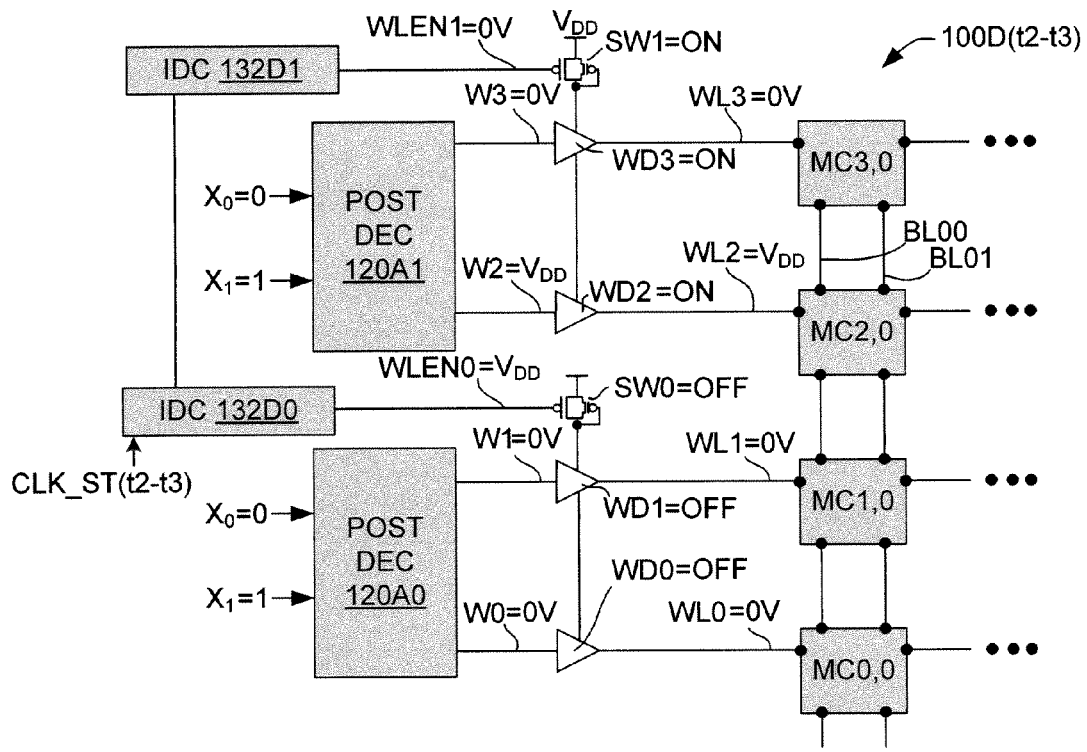

For example, as indicated in FIG. 7(A), in a time period from time t0 to time t1 after read/write operation is initiated (i.e., after a relatively small number of clock pulses are counted), inverted delay circuit 132D0 asserts driver enable signal WLEN0 (WLEN0_=0V) that puts switch element SW0 in an "ON" state, whereby wordline drivers WD0 and WD1 are enabled to generate high voltages on wordlines WL0 and WL1 in response to wordline control signals W0 and W1. Note that, during time period t0 to t1, inverted delay circuit 132D1 maintains driver enable signal WLEN1 in a de-asserted state (WLEN0=0V) that keeps switch element SW1 off and disables wordline drivers WD2 and WD3. As indicated in FIG. 7(B), during a time period t2 to t3 (e.g., after read/write operation is approximately half-way completed, i.e., after a relatively large number of clock pulses are counted), inverted delay circuit 132D0 de-asserts driver enable signal WLEN0 (WLEN0=$V_{DD}$) to disable wordlines WD0 and WD1, and inverted delay circuit 132D1 asserts driver enable signal WLEN1 (WLEN1=0V) to turn-on switch element SW0, whereby wordline drivers WD2 and WD3 are enabled to generate high voltages on wordlines WL2 and WL2 in response to wordline control signals W2 and W3. By maintaining half of the wordline drivers in a disabled state during each read/write operation, memory circuit 100D reduces the amount of leakage in comparison to the embodiment shown in FIG. 4. Those skilled in the art will recognize that two more additional inverted delay circuits (not shown) may be utilized in a manner similar to that described above to facilitate individually enabling/disabling each wordline driver for only the period that each wordline driver is needed during each read/write operation, but that the benefits of reduced leakage achieved by this methology must be balanced against the increased chip area required to implement the more complex inverted delay logic.

Figure 8:
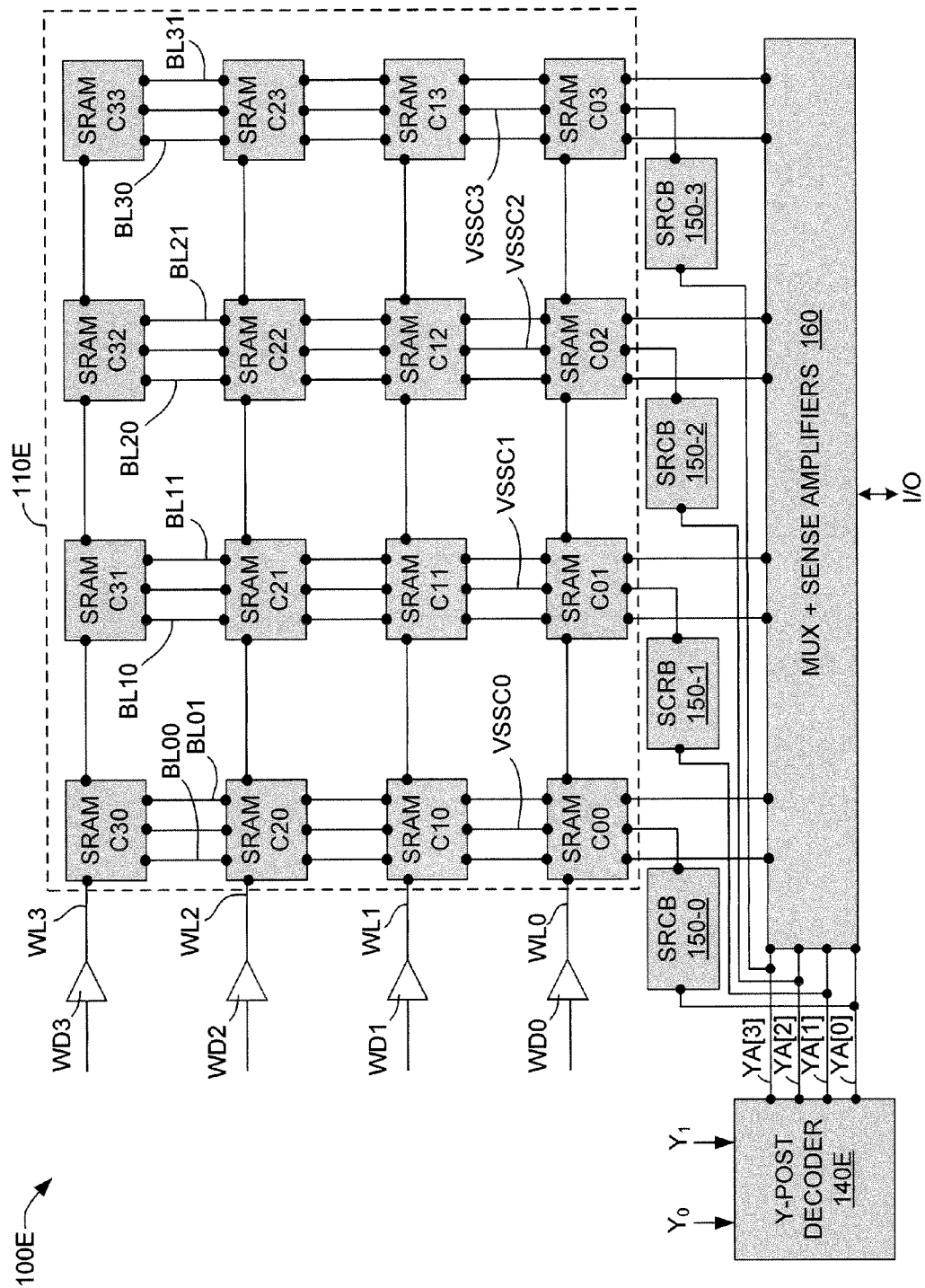
FIG. 8 is a partial circuit/block diagram showing an SRAM circuit according to an embodiment of the present invention.

FIG. 8 is a partial circuit/block diagram showing a memory circuit 100E according to an exemplary column-based source-biasing embodiment of the present invention. Memory circuit 100E is distinguished from previous embodiments in that it includes a memory cell array 110E consisting of static random access memory (SRAM) cells C00 to C33, and the exemplary column-based source-biasing scheme is implemented using source-bias circuits 150-0 to 150-3, which are coupled to the source terminals of associated columns of SRAM cells C00 to C33 by way of signal lines VSSC0 to VSSC3 (e.g., source-bias circuit 150-0 is coupled to the source terminals of SRAM cells C00, C10, C20 and C30 by way of signal line VSSC0). Although the column-based source-biasing scheme implemented by memory circuit 100E is described below with particular reference to SRAM-type memory cells C00 to C33, it is understood that the scheme is not limited to controlling SRAM cells in that it is also beneficially useful in memory arrays implementing other memory cell types (e.g., multi-port memory cells and read-only-memory (ROM) cells).

Figure 9:
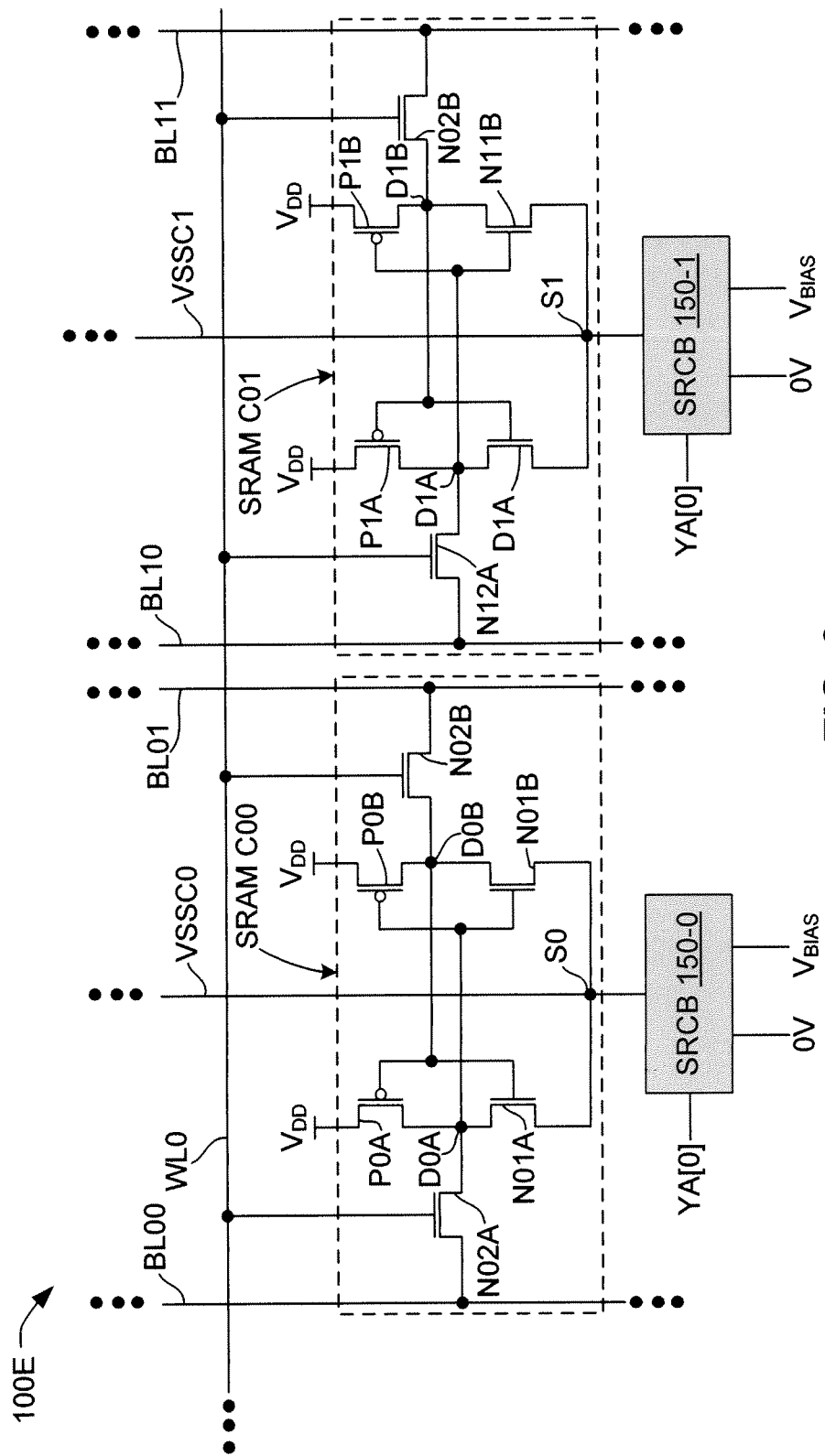
FIG. 9 is a partial circuit diagram showing two SRAM cells of the SRAM circuit of FIG. 8 in additional detail.

FIG. 9 shows exemplary SRAM cells C00 and C01 of array 110E in additional detail. Each SRAM cell of array 110E includes two pairs of pull-up/pull-down devices that are connected in series between system voltage and an associated source terminal in a way that forms a pair of cross-coupled latches that define complementary data nodes (e.g., data nodes D0A and D0B in SRAM cell C00, and data nodes D1A and D1B in SRAM cell C00). The cross-coupled inverters are formed in SRAM cell C00 by a first pull-up P-channel field effect transistor (P-FET) P0A, a second pull-up P-FET P0B, a first pull-down N-channel FET (N-FET) N01A and a second pull-down N-FET N01B. In SRAM cell C00, P-FET P0A has source/drain terminals respectively connected between system voltage source $V_{DD}$ and first data node D0A, and a gate terminal connected to second data node D0B, and P-FET P0B is connected between system voltage source $V_{DD}$ and second data node D0B and is controlled by first data node D0A, N-FET N01A is connected between first data node D0A and a source terminal S0 and is controlled by second data node D0B, and N-FET N01B is connected between second data node D0B and source terminal S0 and is controlled by first data node D0A. Similarly, in SRAM cell C01, P-FET P1A is connected between system voltage source $V_{DD}$ and data node D1A and is controlled by data node D1B, P-FET P1B is connected between system voltage source $V_{DD}$ and data node D1B and is controlled by data node D0A, N-FET N11A is connected between data node D1A and a source terminal S1 and is controlled by data node D1B, and N-FET N11B is connected between data node D1B and source terminal S1 and is controlled by data node D1A.

The two data nodes of each SRAM cell of array 110E operate as the two complementary storage nodes. For example, referring to FIG. 9, when node D0A of SRAM cell C00 is latched to store a logic "0" value (e.g., 0V), node D0B of SRAM cell C00 is latched to store a logic "1" value (e.g., $V_{DD}$). Conversely, when node D0A of SRAM cell C00 is latched to store a logic "1" value (e.g., $V_{DD}$), node D0B of SRAM cell C00 is latched to store a logic "0" value (e.g., 0V). Similarly, nodes D1A and D1B of SRAM cell C01 store complementary logic values.

Referring to FIG. 8, each SRAM column group is accessed by column decoder circuitry (e.g., column post decoder 140) and multiplexer/sense amplifier circuit 160 by way of bitlines BL00 to BL31 during a read/write operation in response to an associated column address signal values. For example, the column group including SRAM cells C00 to C03 is accessed by bitlines BL00 and BL01 in response to associated column address values. For example, when column address values $Y_0$ and $Y_1$ are logic "0", column post decoder 140 generates decoded address value YA[0]=1, which cause multiplexer/sense amplifier circuit 160 to access bitlines BL00 and BL01. Similarly, the column group including SRAM cells C10 to C13 is accessed by way of bitlines BL10 and BL11 in response to column address values $Y_0$=0 and $Y_1$=1, SRAM cells C20 to C23 are accessed by way of bitlines BL20 and BL21 in response to column address values $Y_0$=1 and $Y_1$=0, and SRAM cells C30 to C33 are accessed by bitlines BL30 and BL31 in response to column address values $Y_0$=1 and $Y_1$=1.

The two complementary data nodes of each SRAM cell are coupled to associated bitlines by way of associated transfer transistors that are controlled by associated wordlines during read/write operations. Referring to SRAM cell C00 in FIG. 9, data node N0B and the gate terminals of P-FET P0B and N-FET N01B are coupled to bitline BL00 by way of N-FET N02A, and data node N0A and the gate terminals of P-FET P0A and N-FET N01A are coupled to bitline BL00 by way of N-FET N02A. During a read operation, the bitlines of memory circuit 110E are coupled to appropriate precharge circuitry (not shown) such that the bitlines are pulled to a power supply rail or a reference voltage source (typically $V_{DD}$ or any portion thereof) when the precharge circuitry is activated. During the portion of the read operation in which SRAM cells C00 and C01 are accessed, wordline WL0 is raised to a high voltage (e.g., $V_{DD}$) that turns on transfer N-FETS N02A, N02B, N12A and N12B, thereby coupling data node N0B to bitline BL00, data node N0A to bitline BL01, data node N1B to bitline BL10 and data node N1A to bitline BL11. Depending on the stored logic value, the associated bitlines are either maintained at a high voltage level or pulled low. For example, when a logic values "0" and "1" are respectively stored on nodes N0A and N0B, bitline BL01 is pulled down from the precharge voltage and bitline BL00 is maintained at the precharge voltage. The bitlines of memory circuit 100E are then connected to sense amplifiers by way of a multiplexer in mux/sense amplifier circuit 160, whereby the different voltages on bitlines BL00 and BL01 are used to determine the data bit stored on SRAM cell C00. In a similar manner, complementary logic values are written into SRAM cells C00 and C01 (e.g., by applying complementary voltage values on bitlines BL00 and BL01 while a high voltage is applied to wordline WL0).

In accordance with another aspect of present embodiment, memory circuit 100E includes source biasing circuits 150-0 to 150-3 that respectively apply a selected source voltage to each column group of array 110E during read/write operations by way of source bias control lines VSSC0 to VSSC3. Specifically, source biasing circuit 150-0 provide a source voltage to the column group including SRAM cells C00 to C03 by way of source bias control line VSSC0. Similarly, the source terminals of SRAM cells C10 to C13 are controlled by source biasing circuit 150-1 via source bias control line VSSC1, the source terminals of SRAM cells C20 to C23 are controlled by source biasing circuit 150-2 via source bias control line VSSC2, and the source terminals of SRAM cells C30 to C33 are controlled by source biasing circuit 150-3 via source bias control line VSSC3.

According to another aspect of present embodiment, source biasing circuits 150-0 to 150-3 selectively apply source a low (first) voltage to the source terminals of SRAM cells in a selected column group, and apply a higher (second) source bias voltage to the source terminals of all SRAM cells in non-selected column groups, where the source bias voltage is maintained at a level that minimizes cell leakage. As indicated by the specific embodiment shown in FIG. 9, source bias circuits 150-0 and 150-1 apply either 0V or a source bias voltage (e.g., 2-30% of $V_{DD}$) onto source bias control lines VSSC0 and VSSC1 in accordance with address values YA[0] and YA[1]. For example, during a first time period when address value YA[0] is asserted and address value YA[1] is de-asserted (i.e., to perform a read/write operation on the column group including SRAM cell C00), source bias circuit 150-0 couples source bias control line VSSC0 to the 0V source, whereby source terminal S0 of SRAM cell C00 is maintained at 0V during the relevant portion of the read/write operation. At the same time, source bias circuit 150-1 applies source bias voltage $V_{BIAS}$ onto source bias control line VSSC1, whereby source terminal S1 of SRAM cell C01 is maintained at bias voltage that minimizes cell leakage. Note that during the first time period all other source bias circuits (e.g., source bias circuits 150-2 and 150-3, shown in FIG. 8) maintain the source terminals of all other SRAM cells at bias voltage $V_{BIAS}$.

During subsequent time periods of the read/write operation, when other column address signals are asserted to access another selected column group, the low (0V) signal is applied only the SRAM cells in the selected column group, and the SRAM cells of the non-selected groups are coupled to the source bias voltage. For example, at a subsequent second time period, when column address signal value YA[0] is de-asserted (e.g., YA[0]=0) and address signal value YA[1] is asserted (e.g., YA[1]=1), source bias circuit 150-0 couples source bias control line VSSC0 to source voltage $V_{BIAS}$, and source bias circuit 150-1 couples source bias control line VSSC1 to source voltage 0V, thereby facilitating a read/write operation of the column group including SRAM cell C01. In a preferred embodiment, the application of 0V on the selected column group by source biasing circuits 150-0 to 150-3 is controlled such that $V_{SSC}$ drops to approximately 1 to 2% of supply voltage $V_{DD}$ before one of wordlines WL0 to WL1 is enabled in order to minimize memory access time (i.e., memory access time is unaffected using the column-based source-biasing methodology).

Figure 10:
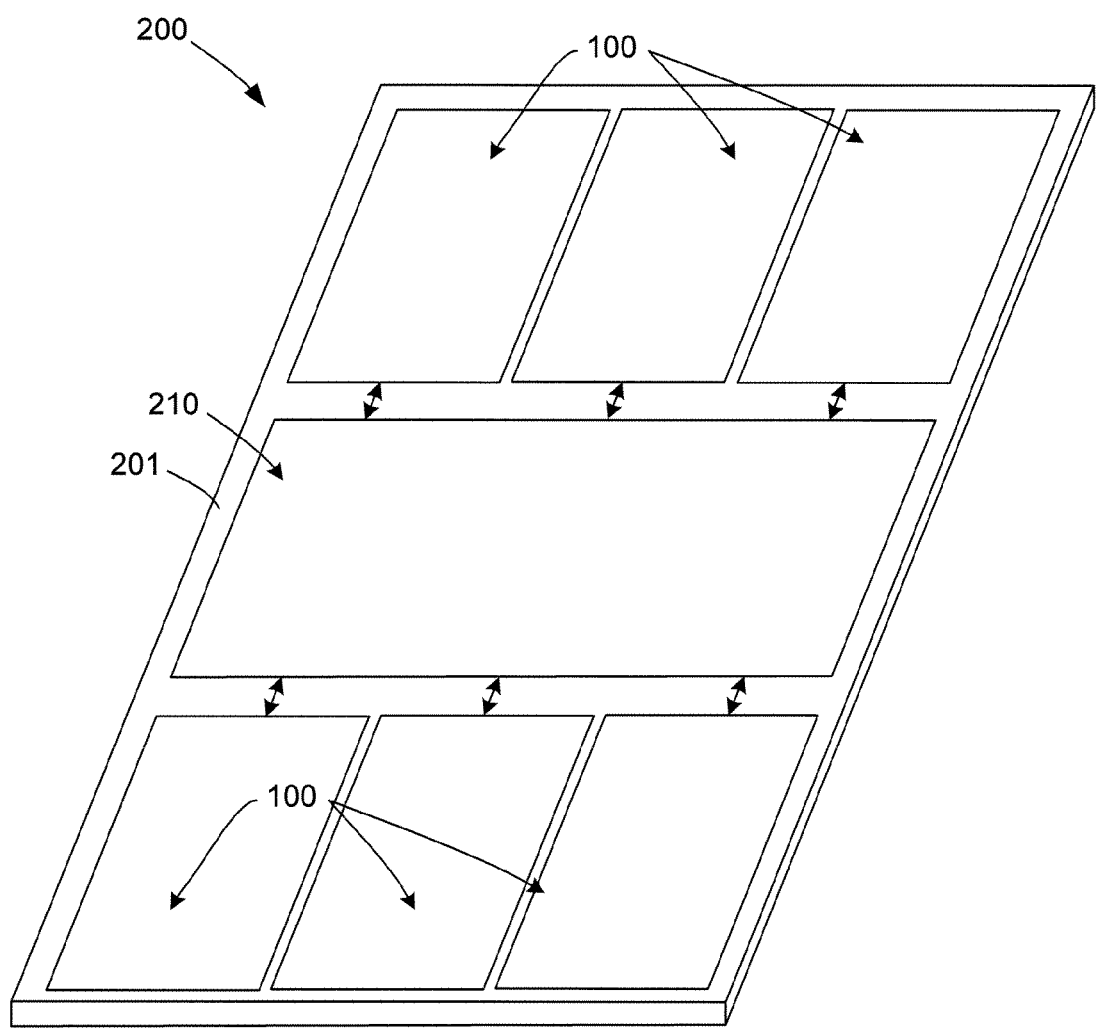
FIG. 10 is a simplified perspective view showing a SoC device including the memory circuits of the present invention.
Figure 11:
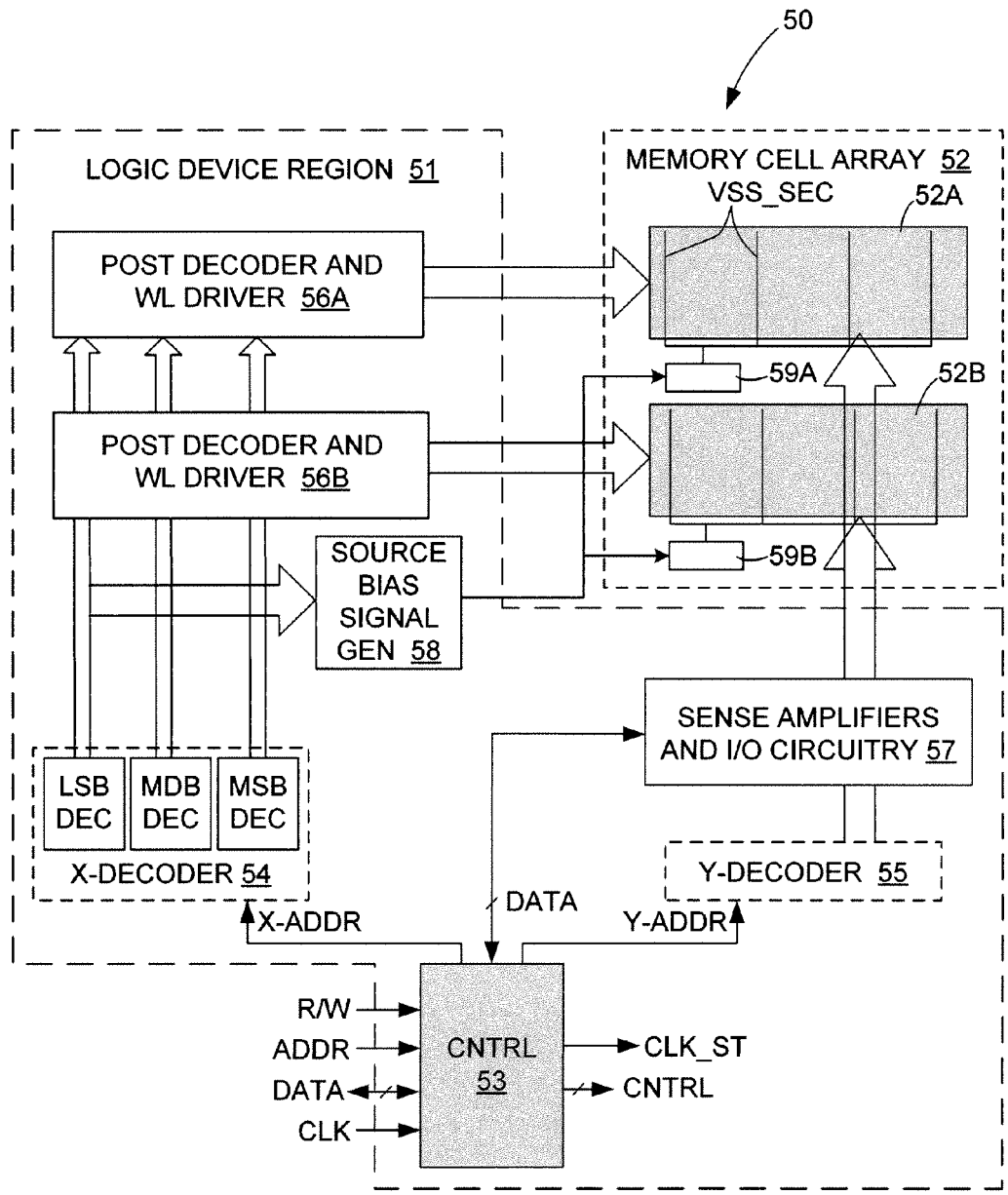
FIG. 11 is a simplified block diagram showing a conventional memory circuit.

FIG. 10 is a simplified perspective view showing a simplified SoC device 200 according to another exemplary embodiment of the present invention. SoC device 200 includes at least one processor circuit 210 and at least one memory circuit 100 that are fabricated on a monocrystalline silicon "chip" (semiconductor substrate) 201 using known semiconductor techniques. Memory circuits 100 are periodically accessed by processor circuit 210 using known techniques and in accordance with a methodology implemented by the SoC device, and are configured using one of the various exemplary embodiments described above with reference to FIGS. 1 to 9 to implement one or both of wordline bias control or source bias control, whereby SoC circuit 200 exhibits reduced current leakage that increases battery life.

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. A memory circuit, comprising:
   a memory cell array including a plurality of memory cells arranged in a plurality of row groups and a plurality of column groups, where each row group of memory cells is connected to an associated wordline of a plurality of parallel wordlines, and each column group of memory cells is connected to at least one associated bitline of a plurality of parallel bitlines;
   a row-address post decoder including means for asserting a single wordline control signal in accordance with an associated row address value generated during a read/write operation;
   a plurality of wordline drivers connected between the row-address post decoder and the plurality of parallel wordlines such that each said wordline driver generates a high voltage signal on an associated one of the plurality of wordlines in response to an associated said asserted wordline control signal;
   means for disabling at least some of the plurality of wordline drivers, said means comprising one or more switch elements connected between a system power source and a power terminal of each of said plurality of wordline drivers, and control means for controlling said one or more switch elements to de-couple one or more of the wordline drivers from the system power source, and
   at least one source bias circuit including means for providing a first voltage to a source terminal of each of the plurality of memory cells in said each accessed column group during a first time period while said associated column address signal value is asserted during the read/write operation, and for providing a second voltage to the source terminal of each of the plurality of memory cells in at least one other adjacent non-accessed column group during the first time period, wherein the first voltage is lower than said second voltage.

2. The memory circuit of claim 1, wherein said control means comprises means for controlling said one or more switch elements using one or more driver enable signals that are generated in response to one of said associated row address signals and a self-timing clock signal.

3. The memory circuit of claim 2, wherein each of said one or more switch elements is connected between the system power source and an associated wordline driver of said plurality of wordline drivers.

4. The memory circuit of claim 2, wherein each of said one or more switch elements is connected between the system power source and two or more associated wordline drivers of said plurality of wordline drivers.

5. The memory circuit of claim 2, wherein said means for controlling said one or more switch elements comprises:
   a first wordline bias circuit for generating a first driver enable signal when said row address signal has a first logic value, whereby said first driver enable signal causes a first switch element to couple said system power source to a first wordline driver of said plurality of wordline drivers; and
   a second wordline bias circuit for generating a second driver enable signal when said row address signal has a second logic value, whereby said second driver enable signal causes a second switch element to couple said system power source to a second wordline driver of said plurality of wordline drivers.

6. The memory circuit of claim 5,
   wherein said first switch element couples said system power source to a first plurality of wordline drivers of said plurality of wordline drivers, whereby said first plurality of wordline drivers are simultaneously enabled when said first driver enable signal is asserted, and said first plurality of wordline drivers are simultaneously disabled when said first driver enable signal is de-asserted, and
   wherein said first switch element couples said system power source to a second plurality of wordline drivers of said plurality of wordline drivers, whereby said second plurality of wordline drivers are simultaneously enabled when said second driver enable signal is asserted, and said second plurality of wordline drivers are simultaneously disabled when said second driver enable signal is de-asserted.

7. The memory circuit of claim 6,
   wherein said second wordline bias circuit further includes means for de-asserting the second driver enable signal while said first wordline bias circuit generates said first driver enable signal, and
   wherein said first wordline bias circuit further includes means for de-asserting the first driver enable signal while said second wordline bias circuit generates said second driver enable signal.

8. The memory circuit of claim 6,
   wherein said first and second switch elements comprise p-channel transistors,
   wherein asserting said first driver enable signal and said second driver enable signal comprises changing said first and second driver enable signals from a first voltage to a second voltage, and
   wherein the second voltage is lower than the first voltage.

9. The memory circuit of claim 2, wherein said means for controlling said one or more switch elements comprises an inverted delay logic circuit that generates said one or more driver enable signals in response to said self-timing clock signal.

10. The memory circuit of claim 9,
    wherein said inverted delay logic circuit asserts said one or more driver enable signals to close said one or more switch elements while said self-timing clock signal has an alternating signal pattern, thereby enabling said plurality of wordline drivers while said self-timing clock signal has said alternating signal pattern, and wherein said inverted delay logic circuit de-asserts said one or more driver enable signals to open said one or more switch elements when said self-timing clock signal has a non-alternating signal pattern, thereby disabling said plurality of wordline drivers while said self-timing clock signal has said non-alternating signal pattern.

11. The memory circuit of claim 9,
wherein said one or more switch elements comprise p-channel transistors,
wherein asserting said one or more driver enable signals comprises changing said one or more driver enable signals from a first voltage to a second voltage, and
wherein the second voltage is lower than the first voltage.

12. The memory circuit of claim 1,
wherein each said memory cell comprises a static random access memory (SRAM) cell including at least one pull-up device coupled between a system voltage terminal and a source terminal, and
wherein the memory circuit further comprises:
means for individually accessing each column group of memory cells by way of said at least one associated bitline during a read/write operation in response to an associated column address signal value.

13. A memory circuit, comprising:
a memory cell array including a plurality of memory cells arranged in a plurality of row groups and a plurality of column groups, where each row group of memory cells is connected to an associated wordline of a plurality of parallel wordlines, and each column group of memory cells is connected to at least one associated bitline of a plurality of parallel bitlines;
a row-address post decoder including means for asserting a single wordline control signal in accordance with an associated row address value generated during a read/write operation;
a plurality of wordline drivers connected between the row-address post decoder and the plurality of parallel wordlines such that each said wordline driver generates a high voltage signal on an associated one of the plurality of wordlines in response to an associated said asserted wordline control signal; and
means for disabling at least some of the plurality of wordline drivers, said means comprising one or more switch elements connected between a system power source and a power terminal of each of said plurality of wordline drivers, and control means for controlling said one or more switch elements to de-couple one or more of the wordline drivers from the system power source,
wherein said control means comprises means for controlling said one or more switch elements using one or more driver enable signals that are generated in response to one of said associated row address signals and a self-timing clock signal,
wherein said means for controlling said one or more switch elements comprises an inverted delay logic circuit that generates said one or more driver enable signals in response to said self-timing clock signal,
wherein said inverted delay logic circuit asserts a first driver enable signal to close a first switch element during a first time period after said self-timing clock signal is enabled, thereby enabling a first group of said plurality of wordline drivers during said first time period, and
wherein said inverted delay logic circuit asserts a second driver enable signal to close a second switch element during a second time period after said self-timing clock signal is enabled, thereby enabling a second group of said plurality of wordline drivers during said second time period.

14. A memory circuit, comprising:
a memory cell array including a plurality of memory cells arranged in a plurality of row groups and a plurality of column groups, where each row group of memory cells is connected to an associated wordline of a plurality of parallel wordlines, and each column group of memory cells is connected to at least one associated bitline of a plurality of parallel bitlines;
a row-address post decoder including means for asserting a single wordline control signal in accordance with an associated row address value generated during a read/write operation;
a plurality of wordline drivers connected between the row-address post decoder and the plurality of parallel wordlines such that each said wordline driver generates a high voltage signal on an associated one of the plurality of wordlines in response to an associated said asserted wordline control signal; and
means for disabling at least some of the plurality of wordline drivers, said means comprising one or more switch elements connected between a system power source and a power terminal of each of said plurality of wordline drivers, and control means for controlling said one or more switch elements to de-couple one or more of the wordline drivers from the system power source,
wherein each said memory cell comprises a static random access memory (SRAM) cell including at least one pull-up device coupled between a system voltage terminal and a source terminal, and
wherein the memory circuit further comprises:
means for individually accessing each column group of memory cells by way of said at least one associated bitline during a read/write operation in response to an associated column address signal value; and
at least one source bias circuit including means for providing a first voltage to the source terminal of each of the plurality of SRAM cells in said each accessed column group during a first time period while said associated column address signal value is asserted during the read/write operation, and for providing a second voltage to the source terminal of each of the plurality of SRAM cells in at least one other non-accessed column group during the first time period, wherein the first voltage is lower than said second voltage,
wherein said at least one source bias circuit comprises a first source bias circuit coupled to the source terminal of each of the plurality of SRAM cells in a first column group and a second source bias circuit coupled to the source terminal of each of the plurality of SRAM cells in a second column group,
wherein said first source bias circuit includes means for providing said first voltage to the source terminal of each of the plurality of SRAM cells in said first column group during a first time period while a first associated column address signal value is asserted during the read/write operation, and
wherein said second source bias circuit includes means for providing said first voltage to the source terminal of each of the plurality of SRAM cells in said second column group during a second time period while a second associated column address signal value is asserted during the read/write operation.

15. The memory circuit of claim 14, wherein said second source bias circuit includes means for providing said second voltage to the source terminal of each of the plurality of SRAM cells in said second column group during the first time period, and wherein said first source bias circuit includes means for providing said second voltage to the source terminal of each of the plurality of SRAM cells in said first column group during the second time period.

16. A memory circuit, comprising:

a memory cell array including a plurality of memory cells arranged in a plurality of row groups and a plurality of column groups, where each row group of memory cells is connected to an associated wordline of a plurality of parallel wordlines, and each column group of memory cells is connected to at least one associated bitline of a plurality of parallel bitlines;

means for individually accessing each column group of memory cells by way of said at least one associated bitline during a read/write operation in response to an associated column address signal value; and at least one source bias circuit including means for providing a first voltage to a source terminal of each of the plurality of memory cells in said each accessed column group during a first time period while said associated column address signal value is asserted during the read/write operation, and for providing a second voltage to the source terminal of each of the plurality of memory cells in at least one other adjacent non-accessed column group during the first time period, wherein the first voltage is lower than said second voltage.

17. The memory circuit of claim 16, wherein each said memory cell comprises a static random access memory (SRAM) cell including at least one pull-up device coupled between a system voltage terminal and a source terminal, wherein said at least one source bias circuit comprises a first source bias circuit coupled to the source terminal of each of the plurality of SRAM cells in a first column group and a second source bias circuit coupled to the source terminal of each of the plurality of SRAM cells in a second column group, wherein said first source bias circuit includes means for providing said first voltage to the source terminal of each of the plurality of SRAM cells in said first column group during a first time period while a first associated column address signal value is asserted during the read/write operation, and wherein said second source bias circuit includes means for providing said first voltage to the source terminal of each of the plurality of SRAM cells in said second column group during a second time period while a second associated column address signal value is asserted during the read/write operation.

18. The memory circuit of claim 17, wherein said second source bias circuit includes means for providing said second voltage to the source terminal of each of the plurality of SRAM cells in said second column group during the first time period, and wherein said first source bias circuit includes means for providing said second voltage to the source terminal of each of the plurality of SRAM cells in said first column group during the second time period.

19. A system on chip (SOC) device comprising:

a semiconductor substrate;

at least one processor circuit fabricated on the semiconductor substrate; and at least one memory circuit fabricated on the semiconductor substrate and coupled to the at least one processor circuit, wherein the at least one memory circuit comprises:

a memory cell array including a plurality of memory cells arranged in a plurality of row groups and a plurality of column groups, where each row group of memory cells is connected to an associated wordline of a plurality of parallel wordlines, and each column group of memory cells is connected to at least one associated bitline of a plurality of parallel bitlines;

a row-address post decoder including means for asserting a single wordline control signal in accordance with an associated row address value generated during a read/write operation;

a plurality of wordline drivers connected between the row-address post decoder and the plurality of parallel wordlines such that each said wordline driver generates a high voltage signal on an associated one of the plurality of wordlines in response to an associated said asserted wordline control signal;

means for individually accessing each column group of memory cells by way of said at least one associated bitline during a read/write operation in response to an associated column address signal value; and at least one of:

at least one wordline bias circuit for disabling at least some of the plurality of wordline drivers; and at least one source bias circuit including means for providing a first voltage to a source terminal of each of the plurality of memory cells in said each accessed column group during a first time period while said associated column address signal value is asserted during the read/write operation, and for providing a second voltage to the source terminal of each of the plurality of memory cells in at least one other non-accessed column group during the first time period, wherein the first voltage is lower than said second voltage.

* * * * *